United States Patent
Hashimoto et al.

(10) Patent No.: US 6,471,769 B2
(45) Date of Patent: *Oct. 29, 2002

(54) METHOD OF MANUFACTURING A NITRIDE SERIES III-V GROUP COMPOUND SEMICONDUCTOR

(75) Inventors: Shigeki Hashimoto; Katsunori Yanashima; Tsunenori Asatsuma; Masao Ikeda, all of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/365,903

(22) Filed: Aug. 3, 1999

(65) Prior Publication Data

US 2002/0073917 A1 Jun. 20, 2002

(30) Foreign Application Priority Data

Aug. 13, 1998 (JP) .......................................... 10-229101

(51) Int. Cl.⁷ .............................................. C30B 25/14
(52) U.S. Cl. ..................... 117/89; 117/101; 117/104; 117/952
(58) Field of Search ................................ 117/104, 952, 117/89, 101

(56) References Cited

U.S. PATENT DOCUMENTS

| | | | |
|---|---|---|---|
| 5,650,198 A | | 7/1997 | Denbaars et al. |
| 5,684,309 A | | 11/1997 | McIntosh et al. |
| 5,902,393 A | * | 5/1999 | Nido et al. .................. 117/952 |
| 5,923,950 A | * | 7/1999 | Ishibashi et al. ............ 117/952 |
| 5,980,632 A | * | 11/1999 | Iyechika et al. ............ 117/952 |
| 6,033,490 A | * | 3/2000 | Kimura et al. ............... 117/952 |

OTHER PUBLICATIONS

Ban, "Mass Spectrometer Studies of Vapor–Phase Crystal Growth", J. Electrochemical Society: Solid State Science and Technology pp. 761–765, Jun. 1972.*

Nakamura et al, Novel metalorganic chemical vapor deposition system for GaN growth, Appl. Phys. Lett. 58, vol. 18, pp. 2021–2023 (1991).

Nishida et al, MOVPE of GaN using a specially designed two–flow horizontal reactor, Journal of Crystal Growth, vol. 170, pp. 312–315 (1997).

* cited by examiner

*Primary Examiner*—Robert Kunemund
(74) *Attorney, Agent, or Firm*—Sonnenschein, Nath & Rosenthal

(57) ABSTRACT

When nitride series III–V group compound semiconductor is manufactured by gas phase growing using starting material for a group III element, ammonia as a starting material for a group V element and hydrogen, the gas phase molar ratio of hydrogen to the total amount of hydrogen and ammonia ($H_2/(H_2+NH_3)$) is specified to $0.3<(H_2/(H_2+NH_3))<0.7$, $0.3<(H_2/(H_2+NH_3))<0.6$ or $0.4<(H_2/(H_2+NH_3))<0.5$. A nitride series III–V group compound semiconductor can thus be manufactured with less non-emission center and of excellent crystallinity.

12 Claims, 4 Drawing Sheets

METHOD OF MANUFACTURING A NITRIDE SERIES III-V GROUP COMPOUND SEMICONDUCTOR

RELATED APPLICATION DATA

The present application claims priority to Japanese Application No. P10-229101 filed Aug. 13, 1998 which application is incorporated herein by reference to the extent permitted by law.

BACKGROUND OF THE INVENTION

1. Field of the Invention

The present invention concerns a method of manufacturing a nitride series III–V group compound semiconductor with improved crystallinity by controlling a flow rate ratio between a starting material gas and a carrier gas.

2. Description of the Related Art

In recent years, a demand for higher density and higher resolution has been increased with regard to recording and reproduction, for example, to optical disks and magneto-optic disks, and development has been made for semiconductor lasers emitting green beam and blue beam in order to shorten the wavelength of a laser beam irradiated to the recording media.

As a material used for manufacturing a semiconductor device capable of emitting a laser beam at a short wavelength, it has been known that nitride series III–V group compound semiconductors such as GaN, AlGaN and GaInN are suitable (for example, Jpn. J. Appl. Phys. 30 (1991) L1998).

In the growing, for example, epitaxial growing, of a nitride series III–V group compound semiconductor, an organic metal gas phase growing method (MOCVD method) capable of controlling the supply of starting material accurately and with reproducibility is suitable.

Further, when the growing of the nitride series III–V group compound semiconductor is conducted by the organic metal gas phase growing method, ammonia can be applied as the starting material for the group V, namely, as the nitrogen starting material.

Ammonia is a relatively thermally stable material and gas phase growing of the nitride series III–V group compound semiconductor using the same as the starting material is conducted at a temperature of 1000 to 1200° C.

Further, since the decomposing efficiency of ammonia is relatively starting and nitrogen starting material species formed after decomposition of ammonia have high vapor pressure, a great amount of ammonia has to be supplied upon growing the nitride series III–V group compound semiconductor using ammonia as the starting material, and the molar ratio of the group V starting material to the group III starting material such as trimethyl gallium (TMGa), trimethyl aluminum (TMAl), trimethyl indium (TMIn) and the like, namely, the group V starting material (mol)/group III starting material (mol) is as high as about 1000 to tens of thousands.

With the situations as described above, an ammonia gas is supplied in an amount as large as possible in a case of growing the nitride series III–V group compound semiconductor.

However, no sufficient studies have been made in the prior art for improving the crystallinity of a compound semiconductor by controlling the ratio of the ammonia gas to be supplied and gases other than ammonia such as a hydrogen gas supplied together. Accordingly, many non-light emission centers are incorporated in the crystals of the thus manufactured semiconductor compound, and it has been desired to improve the crystallinity of the semiconductor compound.

SUMMARY OF THE INVENTION

In view of the above, the present invention provides a method of manufacturing a nitride series III–V group compound semiconductor with an aim of obtaining crystals of excellent light emitting properties in a case of manufacturing the nitride series III–V group compound semiconductor by gas phase growing using a starting material for the group III element, ammonia as starting material for group V element and hydrogen, by controlling the gas phase molar ratio of hydrogen to the total amount of hydrogen and ammonia ($H_2/(H_2+NH_3)$) thereby reducing the number of non-light emission centers incorporated in the crystals.

In the manufacture of a nitride series III–V group compound semiconductor by a gas phase growing using a starting material for a group III element, ammonia as a starting material for a group V element and hydrogen, a method of manufacturing a nitride series III–V group compound semiconductor according to the present invention is conducted by specifying a range of a gas phase molar ratio of hydrogen to the total amount of hydrogen and ammonia ($H_2/(H_2+NH_3)$) within a predetermined range.

The method of manufacturing the nitride series III–V group compound semiconductor according to the present invention is conducted by specifying a range of the gas phase molar ratio of hydrogen to the total amount of hydrogen and ammonia as the starting material for the group V element in the starting gas suitable to the manufacture of the compound semiconductor of excellent crystallinity to $0.3<(H_2/(H_2+NH_3))<0.7$, $0.3<(H_2/(H_2+NH_3))<0.6$ or $0.4<(H_2/(H_2+NH_3))<0.5$.

DETAILED DESCRIPTION OF THE PREFERRED EMBODIMENTS

When a nitride series III–V group compound semiconductor is manufactured by gas phase growing using at least a starting material for the group III element, ammonia as the starting material for the group V element and hydrogen, the method of manufacturing nitride series III–V group compound semiconductor according to the present invention is conducted by specifying a range of a gas phase molar ratio of hydrogen to the total amount of hydrogen and ammonia ($H_2/(H_2+NH_3)$) within a predetermined range.

An example of a method of manufacturing a nitride series III–V group compound semiconductor according to the present invention will be explained with reference to the drawings, but the method of the present invention is not restricted to the example shown below.

Figure 1:
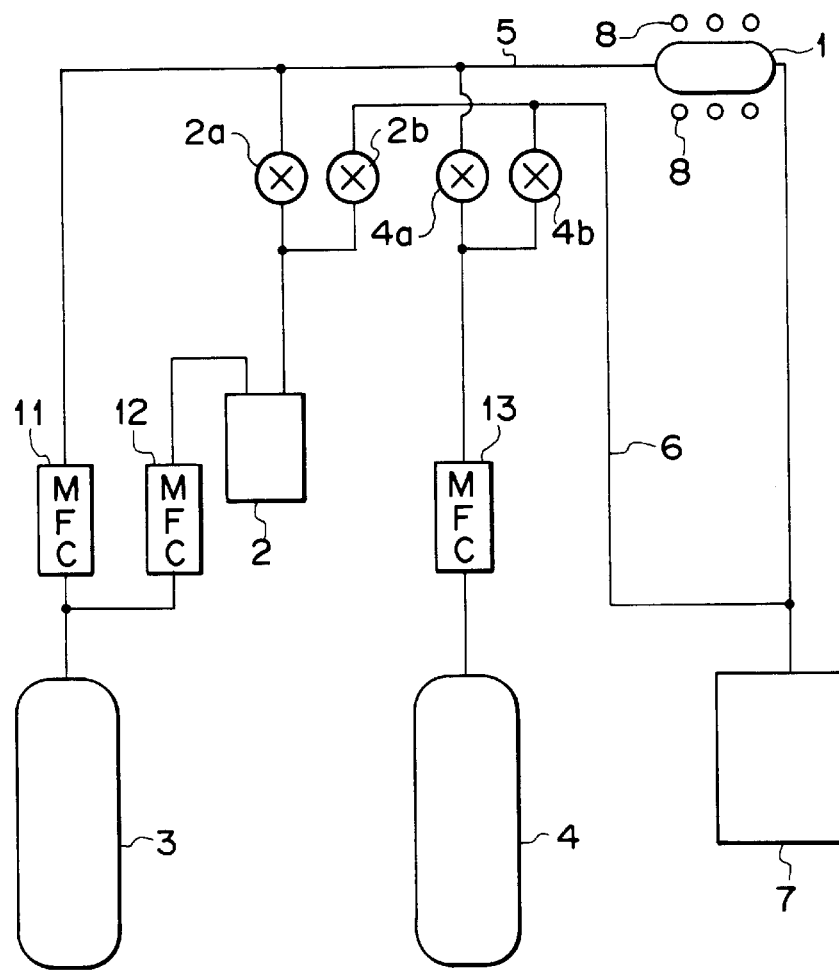
FIG. 1 shows a schematic view of an organic metal gas phase growing device that can be applied in a method of manufacturing a nitride series III–V group compound semiconductor according to the present invention.

FIG. 1 shows a schematic view for an example of an organic metal gas phase growing device (MOCVD device) which can be applied in the method of the present invention.

An organic metal gas phase growing device 10 shown in FIG. 1 has a reaction tube 1 made of a material, for example, quartz glass having a sufficient strength for conducting gas phase growing and also thermally stable, which is provided with comprises a starting gas supply section 2 for supplying a starting gas of a group III element and a purifying device therefor. Further, it also has a hydrogen gas supply section 3 capable of supplying a hydrogen ($H_2$) gas, an ammonia gas supply section 4 capable of supplying an ammonia ($NH_3$) gas, a starting gas supply channel 5 for supplying the starting gas from the gas supply section 2, the ammonia gas from the ammonia gas supply section 4 and the hydrogen gas from the hydrogen gas supply section 3 to the reaction tube 1, a starting gas discharge channel 6 for discharging the ammonia gas, the starting gas and the hydrogen gas out of the reaction tube 1, and an exhaust gas processing device 7 for processing a gas discharged therefrom.

In the organic metal gas phase growing device 10 shown in FIG. 1 described above, while each of the starting gas supply section 2, the hydrogen gas supply section 3 and the ammonia gas supply section 4 is represented by a reservoir or vessel, a structure having a plurality of them corresponding to the kind of the starting materials to be used can be adopted actually.

When a nitride series III–V group compound semiconductor, $B_aAl_bGa_cIn_dN$ (in which a $\geq 0$, b $\geq 0$, c $\geq 0$, d $\geq 0$, a+b+c+d=1), for example, GaN, AlGaN or GaInN is epitaxially grown by the MOCVD method, by using the organic metal gas phase growing device described above, an organic metal starting gas such as trimethyl gallium (TMga), trimethyl aluminum (TMAl), trimethyl indium (TMIn) or triethyl boron (TEB) is supplied as the group III starting material from the starting gas supply section 2.

Further, as the group V starting material, an ammonia gas is supplied from the ammonia gas supply section 4.

The starting material gas supply section 2 and the ammonia gas supply section 4 are connected through the starting gas supply channel 5 to the reaction tube 1 for conducting gas phase growing.

Further, the hydrogen gas supply section 3 is a supply source having a purification device (not illustrated) for supplying a hydrogen gas as a carrier gas or a purge gas the flow rate of which is controlled by mass flow controllers (MFC) 11 and 12.

The starting gas from the starting gas supply section 2 is supplied used switching to the reaction tube 1 or the starting gas discharging channel 6 by a switching unit, for example, a valve 2a or 2b.

Further, the ammonia gas from the ammonia gas supply section 4 is also supplied under switching to the reaction tube 1 or the starting gas discharging channel 6 by a switching unit, for example, gas valve 4a or 4b.

The starting gas supply section 2 contains a starting organic metal starting material, to which the hydrogen gas from the hydrogen gas supply section 3 is blown under flow rate control through the mass flow controller(MFC) 12, and put to bubbling and an organic metal gas is introduced together with the hydrogen gas from the material as supply channel 5 to the aimed reaction tube 1.

On the other hand, the ammonia gas from the ammonia gas supply section 4 is taken out under flow rate control through the MFC 13 and introduced from the starting gas supply channel 5 to the aimed reaction tube 1.

The starting gas and the ammonia gas fed to the reaction tube 1 as described above are sent, as shown in FIG. 2, on a substrate made of sapphire or the like 15 placed on a susceptor 14, for example, made of graphite, which is kept to a constant temperature by a heating unit 8, for example, radio frequency coils, in which thermal decomposition is taken place and an aimed nitride series III–V group compound semiconductor can be manufactured on the substrate 15.

In the method of manufacturing the nitride series III–V group compound semiconductor according to the present invention, gas phase growing is conducted while specifying the range of the gas phase molar ratio of hydrogen to the total amount of hydrogen and ammonia ($H_2/(H_2+NH_3)$) to a predetermined range.

In the specification for the range of the gas phase molar ratio ($H_2/(H_2+NH_3)$), the flow rate of the hydrogen gas supplied from the hydrogen gas supply section 3 and the flow rate of the ammonia gas supplied from the ammonia gas supply section 4 are specified to (flow rate of hydrogen gas)/(total flow rate for the flow rate of hydrogen gas and the flow rate of ammonia gas), namely, $((H_2/(H+NH_3))$ to $0.3< (H_2/(H_2+NH_3))<0.7$, $0.3<(H_2/(H_2+NH_3))<0.6$ or $0.4<(H_2/(H_2+NH_3))<0.5$, by controlling them respectively in the MFC 11–13.

Figure 2:
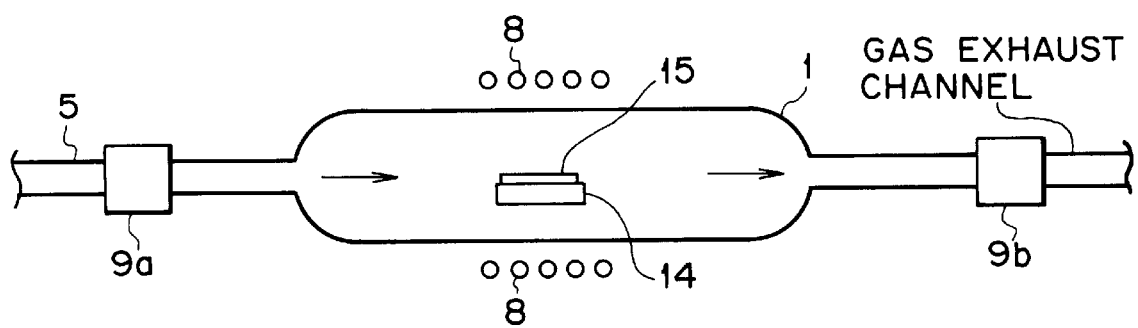
FIG. 2 shows a schematic view for a horizontal type reaction tube constituting an organic metal gas phase growing device that can be applied in a method of manufacturing a nitride series III–V group compound semiconductor according to the present invention.

In the reaction tube 1 shown in FIG. 2, pressure control devices 9a and 9b are disposed on the side of the starting gas supply channel 5 and on the side of the gas exhausting channel respectively, by which the pressure in the reaction tube 1 can be controlled to any of a pressurized state, a normal pressure state and a reduced pressure state.

In this case, the pressurized state means a state in which the pressure in the reaction tube 1 is controlled to a pressure higher than 1 atm intentionally by the pressure control devices 9a and 9b, the reduced pressure state is a state in which the pressure is controlled to a pressure lower than 1 [atm] intentionally by the pressure control devices 9a and 9b, and the normal pressure state is a state of about 0.9 to 1 atm considering a slight pressure change caused by the effects of supply and discharge of the starting gas and the carrier gas in the reaction tube.

As the pressure control devices 9a and 9b, a butterfly valve, a needle valve, a pressure reducing pump, a gas pressurizer, etc. can be applied.

Then, properties of the thus formed crystals are to be explained with reference to a case of forming, for example, a film of GaN:Si crystals on the sapphire substrate 15.

At first, a (0001) sapphire substrate 15 is cleaned by heating, for example, to 1100° C. in a hydrogen atmosphere at a normal pressure of 0.9 to 1.1 atm. Then, the temperature is lowered, for example, to 500° C., and an ammonia gas from the ammonia gas supply section 4 and trimethyl gallium (TMGa) from the starting gas supply section 2 are supplied respectively into the reaction tube 1.

In this manner a GaN buffer layer is at first formed, for example, to a thickness of 30 (nm) on the sapphire substrate 15.

Then, only the ammonia gas is supplied into the reaction tube 1, and the sapphire substrate 15 is heated to a temperature, for example, of about 950 to 1100° C.

Then, the temperature in the reaction tube 1 is kept at about 950 to 1100° C., for example, about 1050° C., trimethyl gallium (TMGa) and monosilane are supplied from the starting gas supply section 2 into the reaction tube 2 and crystal growing is conducted while controlling the pressure, for example, to normal pressure—elevated pressure, for example, at about 1.4 atm and, finally, crystals of GaN:Si can be formed on the sapphire substrate 15.

In this example, the amount of trimethyl gallium (TMGa) supplied is, for example, 30 ($\mu$mol/min) the amount of ammonia supplied is, for example, 6 [SLM (Standard Litter Per minute)] and the amount of monosilane (diluted with 10 ppm hydrogen) supplied is, for example, 1 [SCCM}

Then, the flow rate of ammonia actually contributed to the gas phase growing and the total amount of a carrier gas including the hydrogen gas used for supplying the trimethyl gallium (TMGa) are controlled by mass flow controllers 11–13 shown in FIG. 1, and (flow rate of hydrogen gas)/(sum of the flow rate of hydrogen gas and flow rate of ammonia gas), that is, ($H_2/(H_2+NH_3)$) is selected to a range of: $0.3<(H_2/(H_2+NH_3))<0.7$, preferably, $0.3<(H_2/(H_2+NH_3))<0.6$ and, further preferably, $0.4<(H_2/(H_2+NH_3))<0.5$.

Further, the reaction tube used has a structure provided with a tube for supplying a gas in addition to the tube for supplying starting gases into the reaction tube depending on the case. For example, they there is a reaction tube of supplying a hydrogen gas, a nitrogen gas, various other inert gas or a gas mixture thereof, to press the starting gas so as to be supplied sufficiently on the substrate, or to serve such that an observation window is not cloud upon monitoring the temperature in the reaction tube from the outside. Such gases are generally referred to as a sub-flow or a pressing gas, since they not contribute to the gas phase growing of the compound semiconductor, they are not taken into a consideration in a case of specifying the ratio of the flow rate of the hydrogen gas to the total flow rate of the ammonia gas and the hydrogen gas in the method of the present invention.

Figure 3:
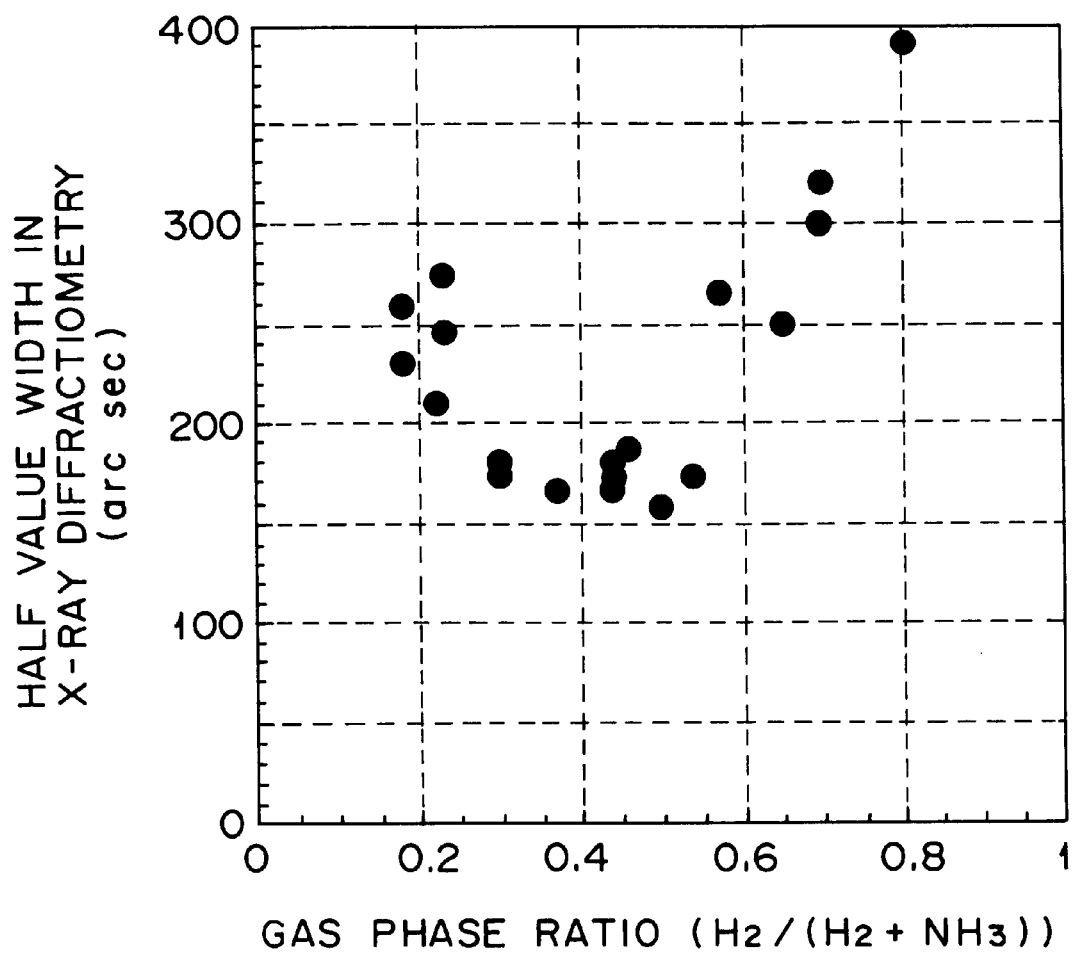
FIG. 3 shows a change of half value width of a X-ray rocking curve for GaN (0004) of nitride series III–V group compound semiconductor manufactured by varying the gas phase molar ratio ($H_2/(H_2+NH_3)$) to various values.

FIG. 3 shows the change of a half value width of a spectral rocking curve for X-ray diffraction of the thus manufactured compound semiconductor in a case of gas phase growing of a GaN:Si semiconductor while varying the gas phase molar ratio ($H_2/(H_2+NH_3)$) to various values.

As shown in FIG. 3, the half value width of the rocking curve decreases as the value for the gas phase molar ratio ($H_2/(H_2+NH_3)$) is increased as shown in FIG. 3. This is because chemical reactions at the surface of crystals can be promoted by supplying an appropriate amount of hydrogen, and crystals of good quality with less fluctuation in the crystal orientation can be grown.

However, if the gas phase molar ratio ($H_2/(H_2+NH_3)$) is further increased, the half value width of the rocking curve increases. This is because the content of the ammonia gas in the starting gas is decreased making the amount of ammonia supplied on the substrate insufficient, and crystals of good quality can no more be produced. Further, if the amount of ammonia supplied on the substrate is insufficient, it worsens the surface state of crystals, causes abnormal growing of crystals and degrades the thickness distribution, to further worsen the film quality of the semiconductor.

As shown in FIG. 3, when gas phase growing is conducted while specifying the gas phase molar ratio ($H_2/(H_2+NH_3)$) within a range of more than 0.3 and less than 0.7, it can be seen that the half value width is less than 250 or less and the crystals of the thus manufactured nitride series III–V group compound semiconductor are of good quality.

Further, when the gas phase growing is conducted while specifying the gas phase molar ratio ($H_2/(H_2+NH_3)$) within a range of more than 0.3 and less than 0.6, the half value width takes a smaller value less than 200 (arc sec), and crystals of good quality can be produced.

Furthermore, when the gas phase growing is conducted while specifying the gas phase molar ratio ($H_2/(H_2+NH_3)$) within a range of more than 0.4 and less than 0.5, the half value width is about 150 (arc sec), and crystals of excellent quality can be produced.

Figure 4:
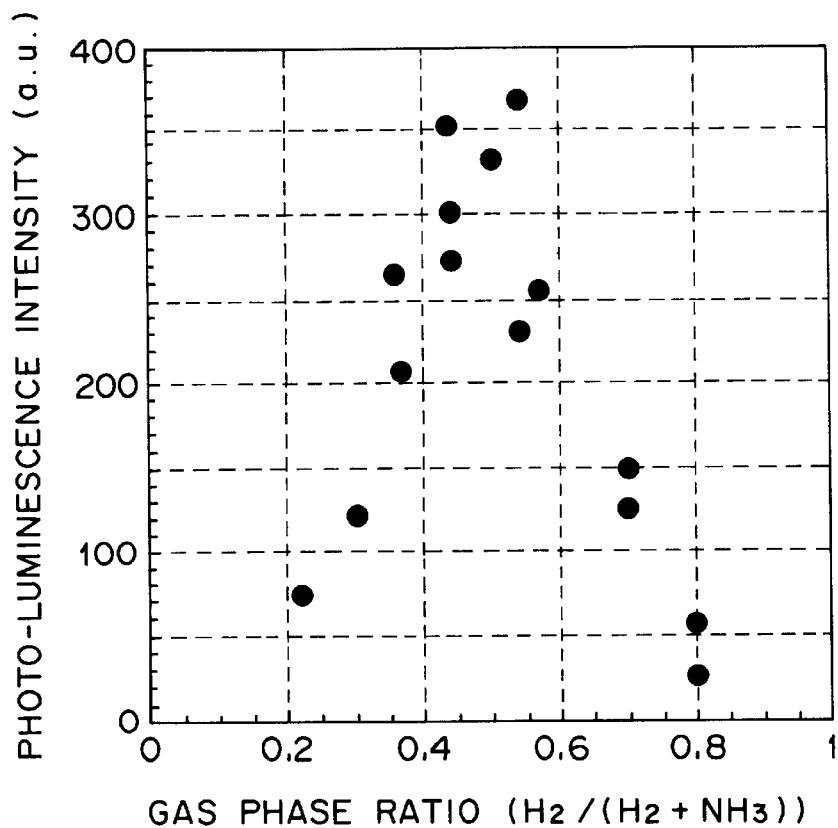
FIG. 4 shows change of an emission intensity of photoluminescence of a nitride series III–V group compound semiconductor manufactured by changing the gas phase molar ratio ($H_2/(H_2+NH_3)$) to various values.

Then, FIG. 4 shows the change of the emission intensity of photo-luminescence of the nitride series III–V group compound semiconductor manufactured when a GaN:Si semiconductor is gas phase grown while changing the gas phase molar ratio ($H_2/(H_2+NH_3)$) to various values.

Figure 5:
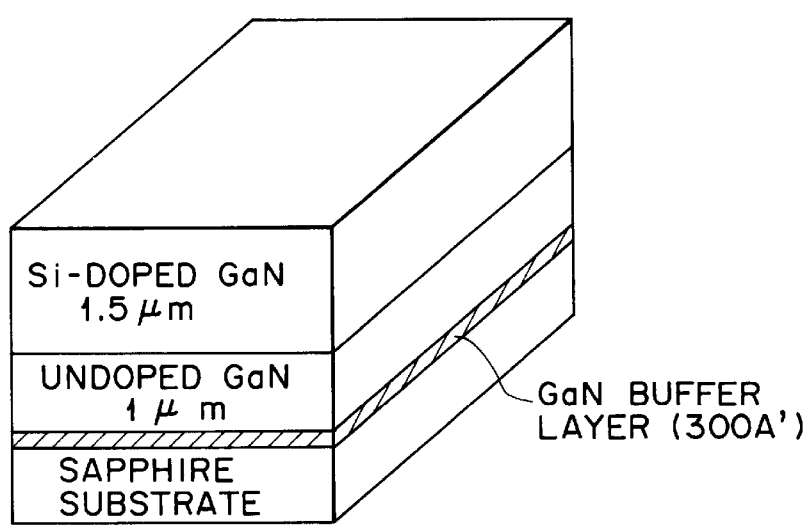
FIG. 5 is schematic perspective view for an example of nitride series III–V group compound semiconductor used for the measurement of the emission intensity of photoluminescence.

FIG. 5 shows a schematic perspective view for an example of nitride series III–V group compound semiconductor crystals used for measurement.

In the measurement, a He-Cd laser at an emission wavelength of 325 nm is used, for example, as a pumping beam.

As shown in FIG. 4, if the gas phase molar ratio ($H_2/(H_2+NH_3)$) is made more than 0.3, the emission intensity of photo-luminescence increases abruptly. This is because the ratio of re-combination of no-emission centers attributable to crystal defects or the like of the thus manufactured nitride series III–V group compound semiconductor is lowered to increase the emission intensity of photo-luminescence. That is, quality of grown crystals can be improved by controlling the gas phase molar ratio ($H_2/(H_2+NH_3)$) to more than 0.3.

However, if the gas phase molar ($H_2/(H_2+NH_3)$) exceeds 0.7 on the other hand, the emitting intensity of photo-luminescence lowers abruptly. This decreases the content of ammonia in the starting gases decreases to lack in the nitride series starting material upon crystal growing of the nitride series III–V group compound semiconductor. This increases non-emission centers in the grown crystals and the emission intensity of photo-luminescence is abruptly lowered. That is, it can be seen that the quality of the grown crystals is worsened if the gases molar ratio ($H_2/(H_2+NH_3)$) exceeds 0.7.

When gas phase growing for the nitride series III–V group compound semiconductor is conducted in the method according to the present invention, it can be conducted in the same manner under any of pressures in the reaction tube, namely, under normal pressure, reduced pressure or elevated pressure, and compound semiconductors of excellent crystallinity can be manufactured in any of the cases by specifying the gas phase molar ratio ($H_2/(H_2+NH_3)$) to the predetermined range described above.

Particularly, in a GaN series compound semiconductor, since the saturation vapor pressure is high and ammonia shows low efficiency of emitting nitrogen atoms by decomposition, nitrogen atoms tends to be evaporated easily from the GaN series compound semiconductor film during gas phase growing.

As a result, the resultant GaN series compound semiconductor film lacks in nitrogen and the film quality is possibly damaged. Then, by conducting the gas phase growing at an elevated pressure higher than 1 (atm) for the pressure in the reaction tube, more nitrogen starting material can be supplied on the substrate and, further, evaporation of nitrogen from the GaN series compound semiconductor film during growing can also be controlled to avoid lack of nitrogen in the resultant GaN series compound semiconductor film, so that it can provide an effect capable of manufacturing a GaN series compound semiconductor of high quality.

In the example described above, the organic metal gas phase growing method (MOCVD method) is applied when gas phase growing of the nitride series III–V group compound semiconductor is conducted, but the method of the present invention is not restricted only to this example, but a hydride gas phase growing method (HVPE method) can also be applied to the method of the present invention.

Further, in the method of manufacturing the nitride series III–V group compound semiconductor according to the present invention, an inert gas such as a nitrogen gas, helium gas, argon gas or a mixture of such gases can be used simultaneously in addition to the hydrogen gas or the ammonia gas upon formation of the film of the nitride series III–V group compound semiconductor on the substrate. In this case, the range for the gas phase molar ratio of hydrogen to hydrogen and ammonia ($H_2/(H_2+NH_3)$) in the mixed gas is specified to a predetermined value.

Figure 6:
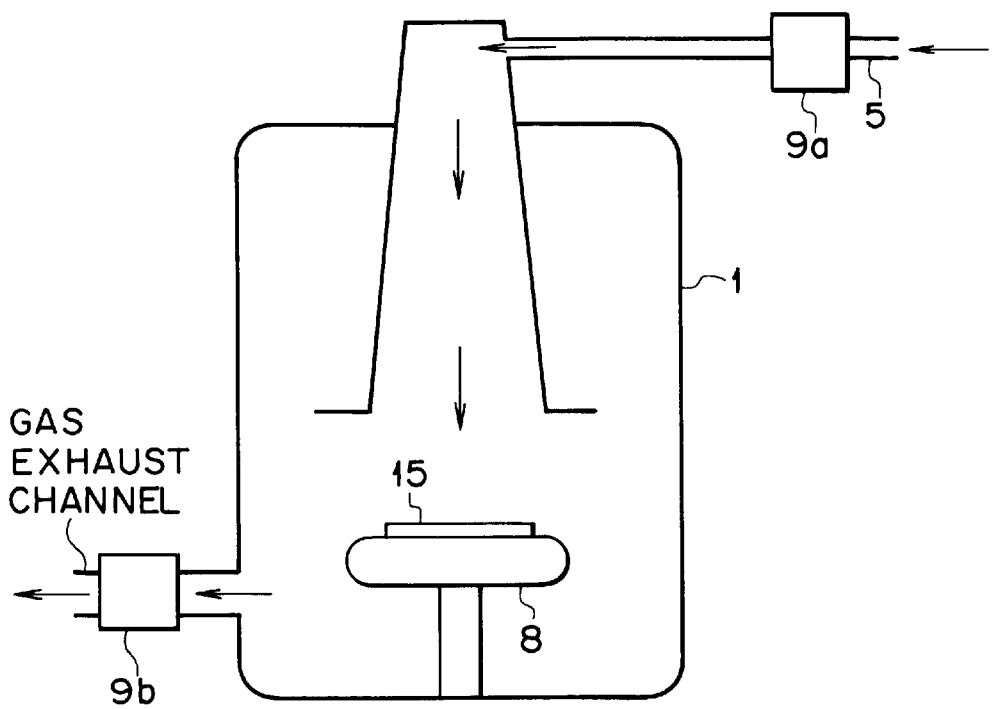
FIG. 6 shows a schematic view of a vertical type reaction tube for constituting an organic metal gas phase growing device that can be applied in a method of manufacturing a nitride series III–V group compound semiconductor according to the present invention

Further, in the example of the method of the present invention described above, explanations have been made to a case of using a so-called horizontal type reaction tube as shown in FIG. 2 as a reaction tube for manufacturing the nitride series III–V group compound semiconductor, the method of manufacturing the compound semiconductor according to the present invention is not restricted only to this example but a so-called vertical reaction tube 20, for example, as shown in FIG. 6 may also be used. In a case of using the vertical type reaction tube 20, the shape can be simplified more than the horizontal type reaction tube. Further, the starting gases and the carrier gas can be caused to flow from below to above depending on the case, to provide an effect capable of avoiding stagnation of starting gases by heat convection.

Figure 7:
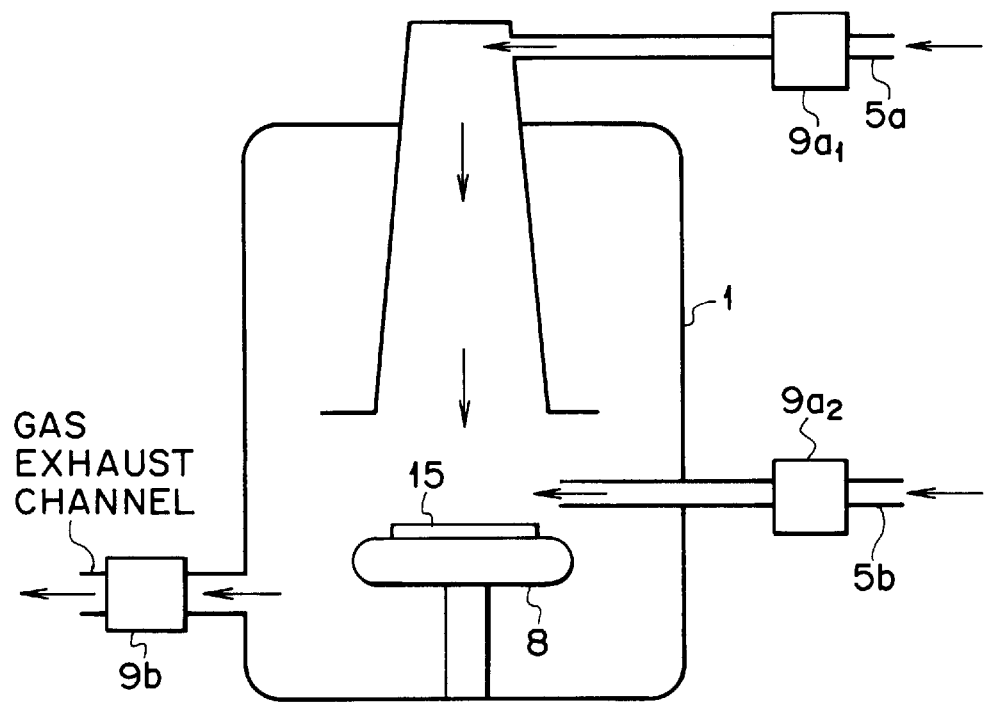
FIG. 7 shows a schematic view for an example of a Two-Flow type reaction tube constituting an organic metal gas phase growing device that can be applied in a method of manufacturing a nitride series III–V group compound semiconductor according to the present invention.

Further, a so-called Two-Flow type reaction tube 30 as shown in FIG. 7 may also be used. When the Two-Flow type reaction tube 30 is used as shown in FIG. 7, since the starting gases are supplied from both of the starting gas supply channels 5a and 5b, the entire starting gases can be urged to the surface of the substrate 15 by the starting gas flowing in the direction vertical from the starting gas supply channel 5a to the substrate 15, which provides an advantages effect capable of improving the quality of crystals of the aimed nitride series III–V group compound semiconductor.

Further, in the example of the method according to the present invention described above, while the RF coil has been used in a case of heating the susceptor in the reaction tube, the invention is not restricted only to this example, but the susceptor can be heated also by using known heater.

As described above, in the method according to the present invention, in the case of manufacturing the nitride series III–V group compound semiconductor by gas phase growing using the starting material for group III element, ammonia as the starting material for group V element and hydrogen by gas phase growing, since it is conduced while specifying the range for the gas phase molar ratio of hydrogen to the total amount of hydrogen and ammonia ($H_2/(H_2+NH_3)$), to a chemical reactions on the surface of the crystals can be promoted, by which crystals of nitride series III–V group compound semiconductor with less non-emission centers and of excellent crystallinity and excellent electric properties can be manufactured.

In the manufacture of the compound semiconductor according to the present invention, since the method of manufacturing a nitride series III–V group compound semiconductor according to the present invention is conducted by specifying a gas phase molar ratio of hydrogen to the total amount of hydrogen and ammonia ($H_2/(H_2+NH_3)$) within a predetermined range, the chemical reactions at the surface of crystals can be promoted to thereby manufacture crystals of nitride series III–V group compound semiconductor with less non-emission centers, of excellent crystallinity and excellent electric properties.

What is claimed is:

1. A method of manufacturing a nitride series III–V group compound semiconductor by a gas phase epitaxial growth by MOCVD using a metal organic gas as a starting material for a group III element, ammonia as a starting material for a group V element and hydrogen, wherein the gas phase molar ratio of hydrogen to the total amount of hydrogen and ammonia (hereinafter referred to as $H_2/(H_2+NH_3)$) is within the range: $0.3<(H_2/(H_2+NH_3))<0.7$; and wherein the number of non-light emission centers produced is less when the ratio is within the range than when the ratio is outside the range.

2. A method of manufacturing a nitride series III–V group compound semiconductor by a gas phase epitaxial growth by MOCVD using a metal organic gas as a starting material for a group III element, ammonia as a starting material for a group V element and hydrogen, wherein the gas phase molar ratio of hydrogen to the total amount of hydrogen and ammonia (hereinafter referred to as $H_2/(H_2+NH_3)$) is within the range: $0.3<(H_2/(H_2+NH_3))<0.6$; and wherein the number of non-light emission centers produced is less when the ratio is within the range than when the ratio is outside the range.

3. A method of manufacturing a nitride series III–V group compound semiconductor by a gas phase epitaxial growth by MOCVD using a metal organic gas as a starting material for a group III element, ammonia as a starting material for a group V element and hydrogen, wherein the gas phase molar ratio of hydrogen to the total amount of hydrogen and ammonia (hereinafter referred to as $H_2/(H_2+NH_3)$) is within the range: $0.4<(H_2/(H_2+NH_3))<0.5$; and wherein the number of non-light emission centers produced is less when the ratio is within the range than when the ratio is outside the range.

4. A method of manufacturing a nitride series III–V group compound semiconductor as claimed in claim 1, wherein the pressure P in the gas phase epitaxial growth is:
P>1 (atm).

5. A method of manufacturing a nitride series III–V group compound semiconductor as claimed in claim 2, wherein the pressure P in the gas phase growing is:
P>1 (atm).

6. A method of manufacturing a nitride series III–V group compound semiconductor as claimed in claim 3, wherein the pressure P in the gas phase epitaxial growth is:
P>1 (atm).

7. A method of manufacturing a nitride series III–V group compound semiconductor as claimed in claim 1, wherein the pressure P in the gas phase epitaxial growth is about 0.9 to 1 atm.

8. A method of manufacturing a nitride series III–V group compound semiconductor as claimed in claim 2, wherein the pressure P in the gas phase epitaxial growth is about 0.9 to 1 atm.

9. A method of manufacturing a nitride series III–V group compound semiconductor as claimed in claim 3, wherein the pressure P in the gas phase epitaxial growth is about 0.9 to 1 atm.

10. A method of manufacturing a nitride series III–V group compound semiconductor as claimed in claim 1, wherein a nitride series III–V group compound semiconductor is manufactured by a gas phase epitaxial growth using a gas mixture of hydrogen and an inert gas.

11. A method of manufacturing a nitride series III–V group compound semiconductor as claimed in claim 2, wherein a nitride series III–V group compound semiconductor is manufactured by a gas phase epitaxial growth using a gas mixture of hydrogen and an inert gas.

12. A method of manufacturing a nitride series III–V group compound semiconductor as claimed in claim 3, wherein a nitride series III–V group compound semiconductor is manufactured by a gas phase epitaxial growth using a gas mixture of hydrogen and an inert gas.

* * * * *